(12) United States Patent
Iwamoto et al.

(10) Patent No.: US 7,324,355 B2
(45) Date of Patent: Jan. 29, 2008

(54) DC-DC CONVERTER

(75) Inventors: Kazuyuki Iwamoto, Kitasaku-gun (JP); Masahiro Tanaka, Kitasaku-gun (JP)

(73) Assignee: Minebea Co., Ltd., Nagano-ken (JP)

( * ) Notice: Subject to any disclaimer, the term of this patent is extended or adjusted under 35 U.S.C. 154(b) by 0 days.

(21) Appl. No.: 11/647,241

(22) Filed: Dec. 29, 2006

(65) Prior Publication Data

US 2007/0159865 A1    Jul. 12, 2007

(30) Foreign Application Priority Data

Jan. 10, 2006 (JP) ............................. 2006-002681

(51) Int. Cl.
 *H02M 3/335* (2006.01)
 *G05F 1/56* (2006.01)
(52) U.S. Cl. ................... 363/21.01; 323/282
(58) Field of Classification Search ............... 363/16, 363/20, 21.01, 131; 323/282, 351
 See application file for complete search history.

(56) References Cited

U.S. PATENT DOCUMENTS 4,720,668 A * 1/1988 Lee et al. ................. 323/271
5,847,942 A * 12/1998 Bazinet et al. ............. 363/25
6,822,427 B2 * 11/2004 Wittenbreder ............ 323/282
6,987,675 B2 * 1/2006 Jovanovic et al. ....... 363/21.01
7,254,047 B2 * 8/2007 Ren et al. ................ 363/21.14

FOREIGN PATENT DOCUMENTS

JP    A 2003-189602    7/2003

* cited by examiner

*Primary Examiner*—Adolf Berhane
(74) *Attorney, Agent, or Firm*—Oliff & Berridge, PLC

(57) ABSTRACT

A DC-DC converter is provided which includes a switching element, a choke coil, a flywheel diode, an output capacitor, a diode, and an auxiliary transformer having primary and secondary windings. The primary winding and the switching element constitute a first series circuit such that one terminal of the primary winding is connected to the drain terminal of the switching element, and the secondary winding and the diode constitute a second series circuit such that one terminal of the secondary winding is connected to the cathode terminal of the diode, where the other terminal of the second winding is connected to the positive terminal of a DC power source, and the anode terminal of the diode is connected to the negative terminal of the DC power source.

9 Claims, 9 Drawing Sheets

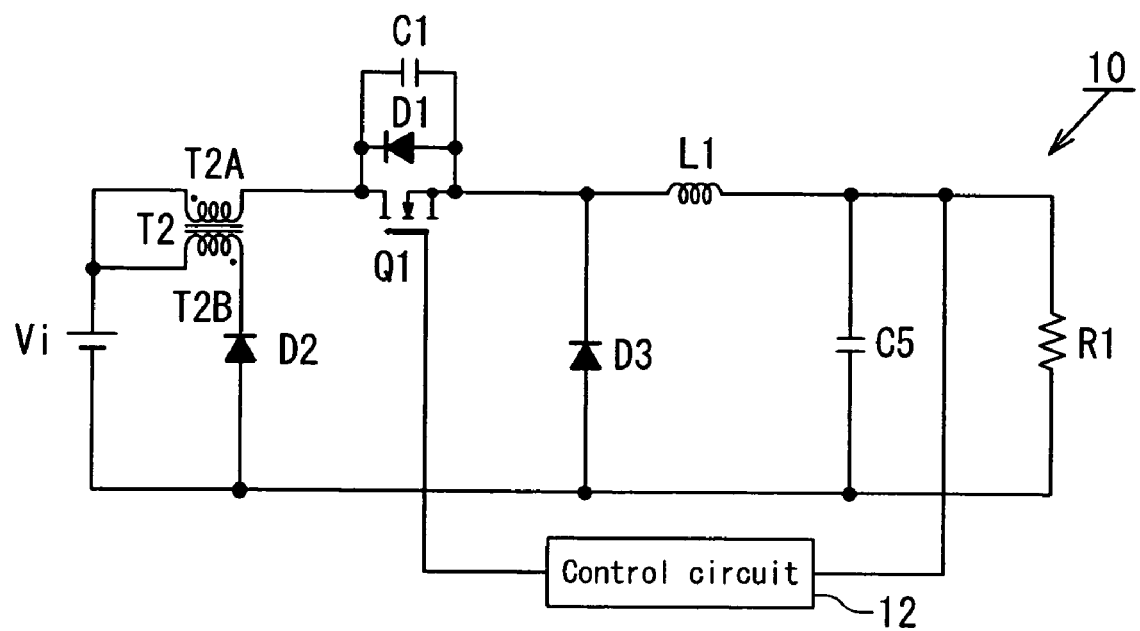
F I G. 1

[Q1 ON]

[Q1 OFF]

F I G. 1 0 A
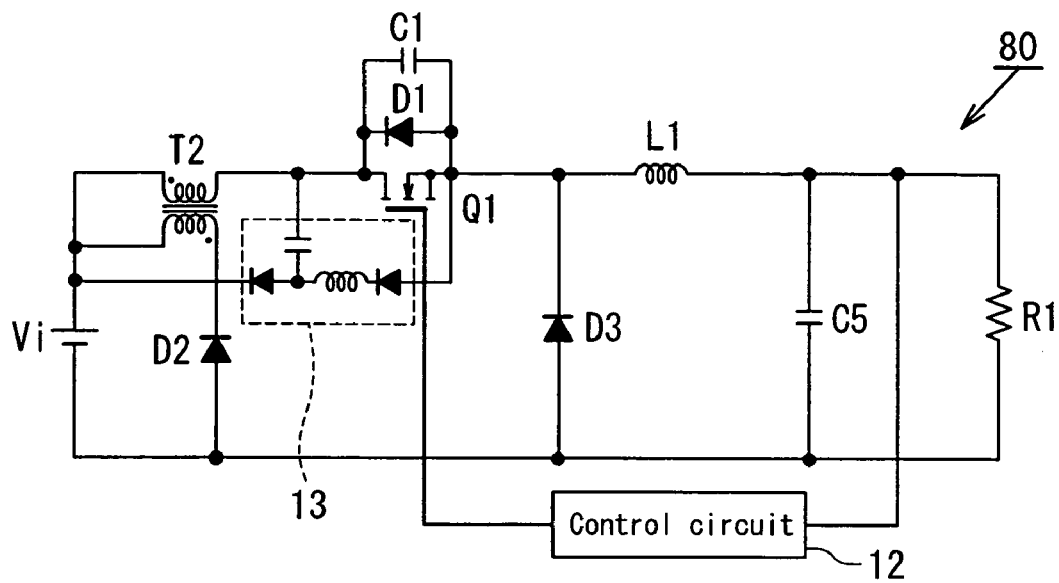
F I G. 1 0 B
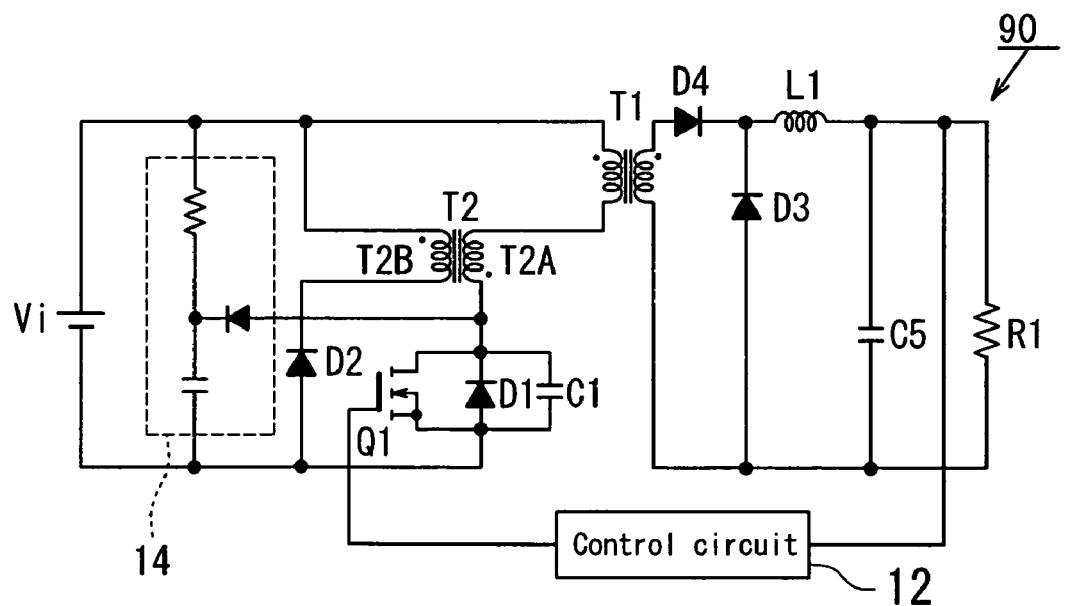

F I G. 1 1  Prior Art
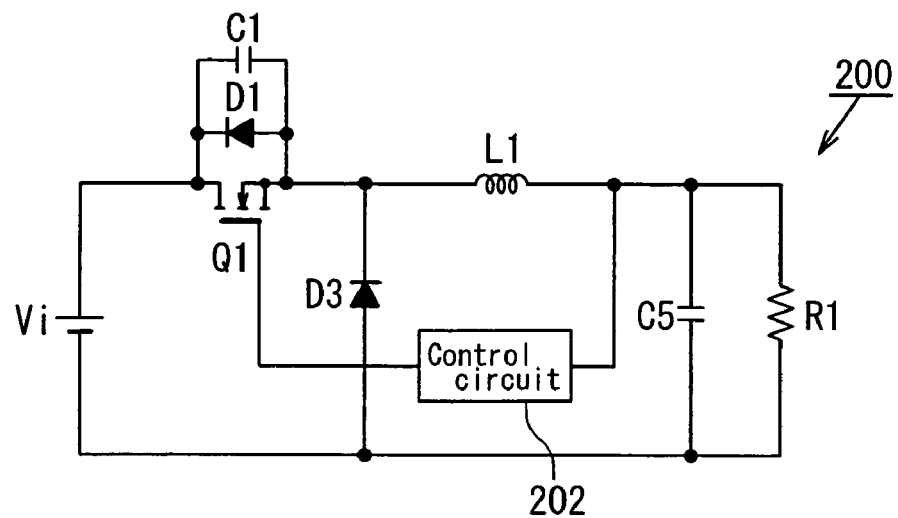
F I G. 1 2  Prior Art
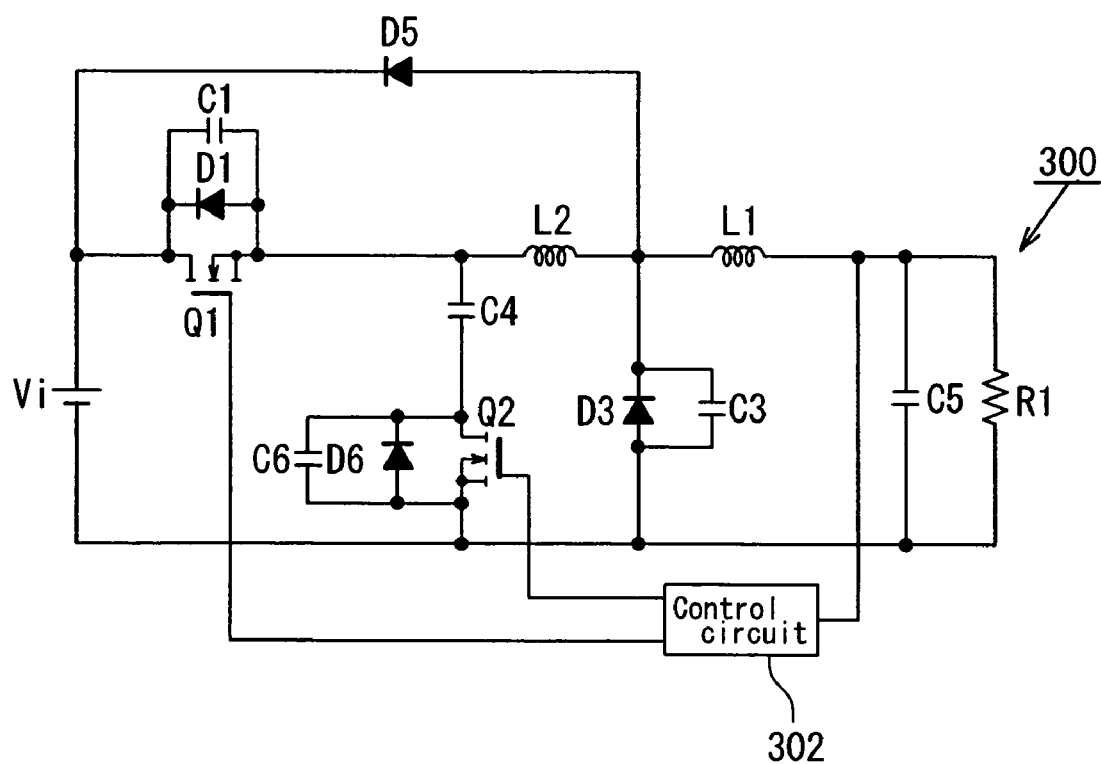

DC-DC CONVERTER

BACKGROUND OF THE INVENTION

1. Field of the Invention

The present invention relates to a DC-DC converter, and particularly to a DC-DC converter which enables reduction of switching loss and loss due to the recovery current of a diode.

2. Description of the Related Art

A DC-DC converter, which converts an inputted DC voltage into a desired stable DC voltage based on the switching control by a semiconductor device, has advantages such as a high efficiency, easy reduction in weight, and the like, and therefore is extensively and indispensably used in power supply for various electronic equipments, in inverter technology based control of electric machines, and in a circuit for lighting a discharge lamp.

FIG. 11 is a circuitry of a typical step-down DC-DC converter. Referring to FIG. 11, a DC-DC converter 200 includes a field effect transistor Q1 as a main switching element, a flywheel diode D3, a choke coil L1, an output capacitor C5, and a control circuit 202, wherein a voltage Vi is a DC power source, and a resistor R1 is a load. A capacitance C1 is a junction capacitance between the drain and source of the field effect transistor Q1, and a diode D1 is a parasitic diode of the field effect transistor Q1.

The DC power source Vi has its positive terminal connected to the drain terminal of the field effect transistor Q1 and has it negative terminal grounded. The source terminal of the field effect transistor Q1 is connected to the cathode terminal of the flywheel diode D3 and also to one terminal of the choke coil L1 which has its other terminal connected to one terminal of the output capacitor C5. The other terminal of the output capacitor C5 and the anode terminal of the flywheel diode D3 are grounded. The control circuit 202 is connected via its detection terminal to the other terminal (toward the load R1) of the choke coil L1 and via its output terminal to the gate terminal of the field effect transistor Q1.

The operation of the DC-DC converter 200 will be explained. Under a steady state condition with the field effect transistor Q1 set turned-off, when the field effect transistor Q1 is turned on, a current flows from the DC power source Vi to the choke coil L1 via the field effect transistor Q1, and a voltage at the other terminal (toward the load R1) of the choke coil L1 is smoothed by the output capacitor C5 and then applied to the load R1. While the field effect transistor Q1 stays turned-on, energy is stored up in the choke coil L1 according to the current. Then, when the field effect transistor Q1 is turned off, electromotive force is generated across the both terminals of the choke coil L1, and the current maintained by the electromotive force commutates to flow through the flywheel diode D3, whereby the energy stored up during the turn-on period of the field effect transistor Q1 is supplied to the load R1.

With repletion of the operation described above, a voltage according to the duty ratio (on-time/on-time+off-time) of the field effect transistor Q1 is outputted across the both terminals of the load R1. In order to keep the output voltage constant irrespective of variations of the input voltage Vi and the load R1, the control circuit 202 performs pulse width modulation (PWM) control, in which the duty ratio of the field effect transistor Q1 is modulated according to a detected output voltage.

In the DC-DC converter 200 described above, due to the junction capacitance C1 formed between the drain and source terminals of the field effect transistor Q1 and also due to wiring-related parasitic inductances, a transitional period, at which a non-zero voltage across the drain and source terminals and a non-zero drain current are concurrently present, arises at the moment when the field-effect transistor Q1 turns on or turns off, and thereby a switching loss is caused. Since the switching loss becomes larger with increase of a frequency for performing on-off control, a serious problem is involved when reduction of the dimension and weight of an apparatus is sought to be achieved by increasing the on-off control frequency so as to reduce the inductance of a choke coil and the capacitance of an output capacitor. Further, there is another problem that when the field effect transistor Q1 turns off thereby reverse-biasing the flywheel diode D3, a large recovery current is caused to flow from the cathode to the anode at the reverse recovery time resulting in causing a heavy loss.

Under the circumstances described above, what is called a "soft switching technique" is conventionally applied which utilizes resonance thereby reducing switching loss or loss attributable to the recovery current. For example, Japanese Patent Application Laid-Open No. 2003-189602 discloses a DC-DC converter as shown in FIG. 12, in which a resonant circuit uses the junction capacitance of a switching element and a rectifying element in order to deal with an extensive range of an input and output voltage variation.

Referring to FIG. 12, in a DC-DC converter 300, the source terminal of a field effect transistor Q1 is connected via a resonant coil L2 to the junction of a flywheel diode D3 and a choke coil L1, and a series circuit composed of the resonant coil L2 and the flywheel diode D3 is connected in parallel to a series circuit composed of a resonant capacitor C4 and a field effect transistor Q2. A diode D6 and a capacitor C6 are connected in parallel across the drain and source terminals of the field effect transistor Q2, a diode D1 and a capacitor C1 are connected in parallel across the drain and source terminals of the field effect transistor Q1, and a diode D5 is connected in parallel to a series circuit composed of the field effect transistor Q1 and the resonant coil L2. In the DC-DC converter 300 described above, the switching loss and noises can be reduced due to a zero-voltage switching realized by the resonance between the resonant coil L2 and the capacitors C1 and C6 (parallel capacitors) of the field effect transistors Q1 and Q2.

However, the DC-DC converter 300 requires a plurality (two in the figure) of field effect transistors Q1 and Q2, and a resonant capacitor C4, which invites an increase in component cost and also in structural dimension. And, while the switching loss of the field effect transistor Q1 as a main switching element and the loss of the flywheel diode D3 are reduced, losses are otherwise incurred at the field effect transistor Q2 as an auxiliary switching element and at the resonant coil L2, which results in that the operating efficiency of the DC-DC converter 300 is not tangibly improved as a whole.

SUMMARY OF THE INVENTION

The present invention has been made in light of the above problems, and it is an object of the present invention to provide a DC-DC converter, in which the switching loss of a switching element and the loss attributable to recovery current of a diode are reduced, and which operates efficiently and can be downsized and produced inexpensively.

In order to achieve the object described above, according to an aspect of the present invention, there is provided a DC-DC converter which includes: a switching element to perform a switching operation thereby converting a DC electric power supplied from a DC power source (Vi) into an AC electric power; an inductance element to store up and discharge the AC electric power; and a rectifying smoothing circuit which rectifies and smoothes the AC electric power discharged and reconverts the AC electric power back into a DC electric power, and which includes a rectifying smoothing circuit diode and an output capacitor. The DC-DC converter described above further includes an auxiliary transformer having a primary winding and a secondary winding, and a diode, wherein: the primary winding and either the switching element or the rectifying smoothing circuit diode constitute a first series circuit such that the primary winding is connected in series to either the switching element or the rectifying smoothing circuit diode; and the secondary winding and the diode constitute a second series circuit such that the secondary winding is connected in series to the diode, where one terminal of the second series circuit is connected to one terminal of either the DC power source or the output capacitor, and the other terminal of the second series circuit, together with the other terminal of the output capacitor, is connected to the other terminal of the DC power source. In the DC-DC converter structured as above, an electromagnetic energy stored up in the auxiliary transformer is either returned to the DC power source via the second series circuit or discharged to the output side when the switching element turns on and off.

In the DC-DC converter structured as above, since the primary winding of the auxiliary transformer is connected in series to either the switching element or the rectifying smoothing circuit diode, the current, which starts to flow in the switching element after the switching element is turned on, is caused to increase with an inclination during its rise period due to the inductance of the primary winding of the auxiliary transformer, and therefore the current is almost 0 A when the switching element is turned on, thus a zero-voltage switching is achieved thereby reducing the switching loss. Also, since a voltage is applied across the rectifying smoothing circuit diode after the current flowing in the rectifying smoothing circuit diode, which is caused to decrease with an inclination, arrives at 0 A, the loss due to the recovery current of the rectifying smoothing circuit diode is reduced. And, since the electromagnetic energy stored up in the auxiliary transformer is returned to the DC power source via the second series circuit or discharged to the output side, it is prevented from happening that a high voltage, which may damage the switching element, is generated when the switching element turns on and off, and at the same time the efficiency of the DC-DC can be enhanced.

In the aspect of the present invention, the DC-DC converter may be structured such that: the first series circuit includes the switching element; the rectifying smoothing circuit includes the rectifying smoothing circuit diode which has one terminal thereof connected to one terminal of the inductance element, and the output capacitor which has one terminal thereof connected to the other terminal of the inductance element; one terminal of the first series circuit is connected to the one terminal of the DC power source, and the other terminal of the first series circuit is connected to the junction of the inductance element and the rectifying smoothing circuit diode; and the other terminal of the rectifying smoothing circuit diode, together with the other terminal of the output capacitor, is connected to the other terminal of the DC power source. Thus, the DC-DC converter is suitably structured as a step-down DC-DC converter.

In the aspect of the present invention, the DC-DC converter may be structured such that: the first series circuit includes the rectifying smoothing circuit diode; the rectifying smoothing circuit includes the first series circuit which has one terminal thereof connected to one terminal of the inductance element, and the output capacitor which has one terminal thereof connected to the other terminal of the inductance element; one terminal of the switching element is connected to the one terminal of the DC power source, and the other terminal of the switching element is connected to the junction of the inductance element and the first series circuit; and the other terminal of the first series circuit, together with the other terminal of the output capacitor, is connected to the other terminal of the DC power source. Thus, the DC-DC converter is suitably structured as a step-down DC-DC converter.

In the aspect of the present invention, the DC-DC converter may be structured such that: the first series circuit includes the switching element; the rectifying smoothing circuit includes the rectifying smoothing circuit diode which has one terminal thereof connected to one terminal of the inductance element, and the output capacitor which has one terminal thereof connected to the other terminal of the rectifying smoothing circuit diode; the other terminal of the inductance element is connected to the one terminal of the DC power source; and one terminal of the first series circuit is connected to the junction of the inductance element and the rectifying smoothing circuit diode, and the other terminal of the first series circuit, together with the other terminal of the output capacitor, is connected to the other terminal of the DC power source. Thus, the DDC-DC converter is suitably structured as a step-up DC-DC converter.

In the aspect of the present invention, the DC-DC converter may be structured such that: the first series circuit includes the rectifying smoothing circuit diode; the rectifying smoothing circuit includes the first series circuit which has one terminal thereof connected to one terminal of the inductance element, and the output capacitor which has one terminal thereof connected to the other terminal of the first series circuit; the other terminal of the inductance element is connected to the one terminal of the DC power source; and one terminal of the switching element is connected to the junction of the inductance element and the first series circuit, and the other terminal of the switching element, together with the other terminal of the output capacitor, is connected to the other terminal of the DC power source. Thus, the DC-DC converter is suitably structured as a step-up DC-DC converter.

In the aspect of the present invention, the DC-DC converter may further include a main transformer to insulate between the input side and the output side. Thus, the DC-DC converter may be structured into a forward converter or flyback converter.

In the aspect of the present invention, the DC-DC converter may further include a snubber circuit. With this structure, the switching element can be protected especially from the surge voltage attributable to the leakage inductance of the auxiliary transformer.

Thus, according to the present invention, a DC-DC converter can be provided, in which the switching loss of a switching element and the loss due to the recovery current of a rectifying element can be reduced, and the at the same time which achieves a high efficiency, a small structural dimension, and a low cost without requiring an auxiliary switching element and a resonant capacitor.

BRIEF DESCRIPTION OF THE DRAWINGS

FIG. 1 is a circuit diagram of an exemplar of a DC-DC converter according to a first embodiment of the present invention;

FIGS. 2A and 2B each show a state of current at the operation of the DC-DC converter of FIG. 1, wherein FIG. 2A is for an on-period of a switching element, and FIG. 2B is for an off-period of the switching element;

FIGS. 10A, 10B and 10C are circuit diagrams of three exemplars of DC-DC converters according to a seventh embodiment of the present invention, having respective different snubber circuits;

FIG. 11 is a circuit diagram of a conventional DC-DC converter; and

FIG. 12 is a circuit diagram of another conventional DC-DC converter.

DETAILED DESCRIPTION OF THE INVENTION

Figure 2A:
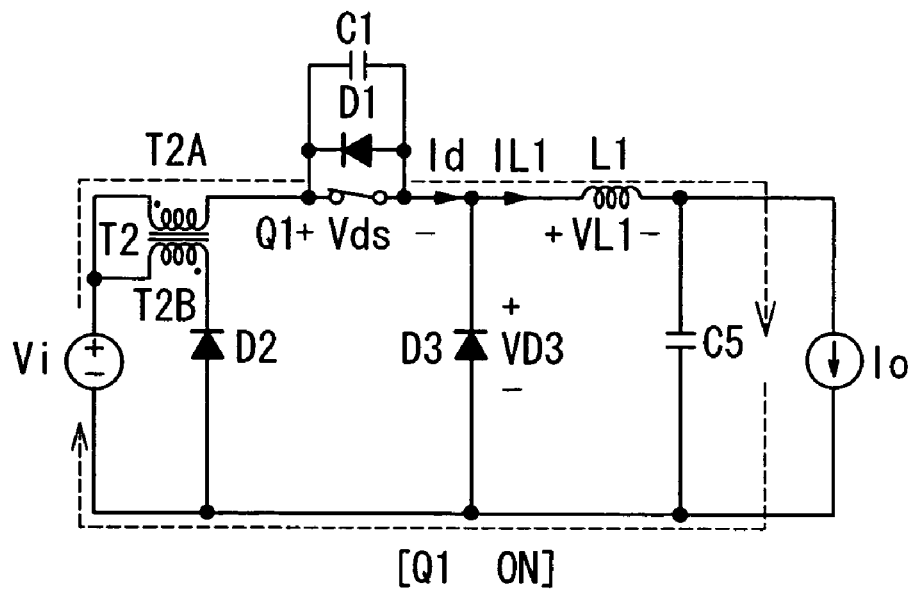

Exemplary embodiments of the present invention will be described with the accompanying drawings. In explaining the drawings, any corresponding component parts are denoted by the same reference numerals, and a detailed description of the overlapping portion will be appropriately omitted below.

Referring to FIG. 1, a DC-DC converter 10 according to a first embodiment of the present invention is a step-down DC-DC converter, and includes a switching element Q1, a choke coil L1 as inductance element according to the present embodiment, an output capacitor C5, a flywheel diode D3 as a rectifying smoothing circuit diode according to the present invention, an auxiliary transformer T2 having primary and secondary windings T2A and T2B, and a control circuit 12. In the DC-DC converter 10, a DC electric power supplied from a DC power source Vi is converted into a predetermined AC electric power by the switching operation of the switching element Q1 and stored up in the choke coil L1, and the AC electric power discharged from the choke coil L1 is converted into a DC electric power again by means of a rectifying smoothing circuit composed of the flywheel diode D3 and the output capacitor C5 and is then supplied to a load R1.

The switching element Q1 is preferably a field effect transistor, and a diode D1 and a capacitor C1, which are connected in parallel to the switching element Q1, are respectively an inherent body diode of the field effect transistor and a junction capacitance between the drain and source of the field effect transistor. The present invention is not limited to any specific type of element, and the switching element Q1 may alternatively be a bipolar transistor, insulated gate bipolar transistor (IGBT), and the like. And, depending on the characteristic of the element used, the aforementioned capacitor C1 and diode D1 may be components provided externally.

The primary and secondary windings T2A and T2B of the auxiliary transformer T2 are magnetically connected to each other and wound with a turn ratio of NAB (=number of turns on T2B/number of turns on T2A) such that the voltages at the primary and secondary windings T2A and T2B have their respective polarities reversed. The primary winding T2A and the switching element Q1 constitute a series circuit (first series circuit) such that one terminal of the primary winding T2A is connected to the drain terminal of the switching element Q1, and the secondary winding T2B and a diode D2 constitute a series circuit (second series circuit) such that one terminal of the secondary winding T2B is connected to the cathode terminal of the diode D2. The other terminal of the secondary winding T2B is connected to one terminal of the DC power source Vi, and the anode terminal of the diode D2 is connected to the negative terminal of the DC power source Vi.

The rectifying smoothing circuit is composed of the flywheel diode D3 which has its cathode terminal connected to one terminal of the choke coil L1, and the output capacitor C5 which has its one terminal (output terminal) connected to the other terminal of the choke coil L1, wherein the anode terminal of the flywheel diode D3, together with the other terminal of the output capacitor C5, is connected to the negative terminal of the DC power source Vi. One terminal (toward the primary winding T2A) of the first series circuit is connected to the positive terminal of the DC power source Vi, and the other terminal (toward the source of the switching element Q1) of the first series circuit is connected to the junction of the choke coil L1 and the cathode terminal of the flywheel diode D3.

The detection terminal of the control circuit 12 is connected to the junction of the output capacitor C5 and the choke coil L1, and the output terminal of the control circuit 12 is connected to the gate terminal of the switching element Q1, wherein the switching operation of the switching element Q1 is pulse width modulation (PWM) controlled by the gate driving signal outputted from the output terminal thereby maintaining a predetermined output voltage. Thus, the DC-DC converter 10 is adapted to perform a step-down operation.

The operation of the DC-DC converter 10 will hereinafter be described. For easy understanding of the fundamental operation, it is assumed here that the on-resistance of the switching element Q1, the forward voltages of the respective diodes, and the parasitic capacitance of the switching element Q1 are all zero. Description will be made, with reference to FIGS. 2A, 2B and 3, on the stage where the switching element Q1 is turned on for a stationary operation, and the stage where the switching element Q1 is then turned off.

Figure 2B:
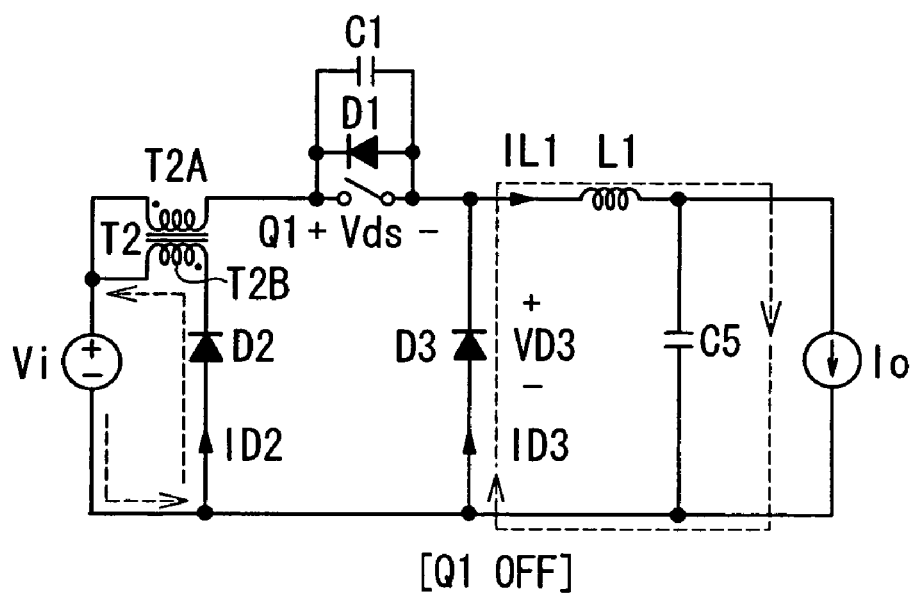
Figure 3:
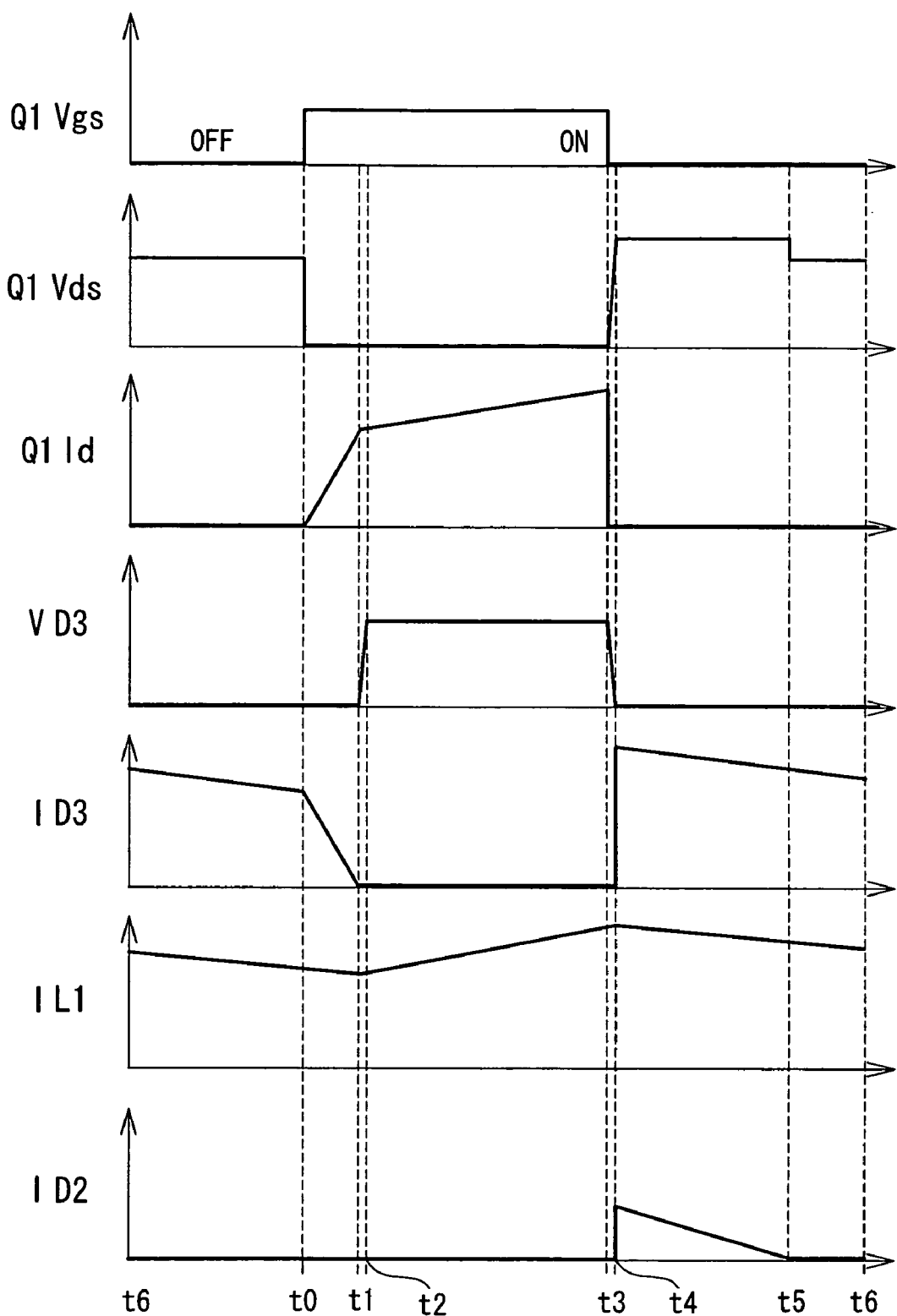
FIG. 3 is a timing chart for the operation of the DC-DC of FIG. 1.

Referring to FIGS. 2A, 2B and 3, Vgs refers to a voltage across the gate and source terminals (gate-to-source voltage) of the switching element Q1, Vds refers to a voltage across the drain and source terminals (drain-to-source voltage) of the switching element Q1, VL1 refers to a voltage across the both terminals of the choke coil L1, and VD3 refers to a voltage across the both terminals of the flywheel diode D3, wherein a direction from − to + indicated at each voltage in FIGS. 2A and 2B is defined as a positive direction. Further, Id refers to a drain current flowing in the switching element Q1, ID3 refers to a current flowing in the flywheel diode De3, IL1 refers to a current flowing in the choke coil L1, and ID2 refers to a current flowing in the diode D2, wherein a direction indicated by each arrow in FIGS. 2A and 2B is defined as a positive direction (in this connection, it is assumed that a current flowing through the junction capacitance C1 and the body diode D1 of the switching element Q1 is not included in the drain current Id, and that a certain current Io is applied to the load R1 throughout the entire stage of operation).

FIG. 2A shows a state of current at an on-period (period t2-t3 in FIG. 3) of the switching element Q1, and FIG. 2B shows a state of current at an off-period (period t3-t5 in FIG. 3) of the switching element Q1.

When the switching element Q1 is in an on-state at period t2-t3 as shown in FIG. 3, the drain current Id flows from the DC power source Vi to the switching element Q1 via the primary winding T2A of the auxiliary transformer T2, the current IL1 flows in the choke coil L1 as shown in FIG. 2A, and an electromagnetic energy generated by the current IL1 is stored up in the choke coil L1. At this period, the voltage VD3 in a reverse bias direction is applied to the flywheel diode D3, thus the current ID3 is not caused to flow, and accordingly the current IL1 keeps equal to the drain current Id. The drain current Id flows in the primary winding T2A of the auxiliary transformer T2, and a voltage is induced in the secondary winding T2B so as to have a reverse direction with respect to the diode D2. Consequently, a current is not caused to flow in the secondary winding T2B, and therefore an electromagnetic energy generated by the current Id is stored up in the auxiliary transformer T2, Then, when the switching element Q1 is turned off at time t3, the drain current Id drops to zero as shown in FIG. 2B, then the flywheel diode D3 is caused to conduct, and the current IL1 starts to commutate as the current ID3 of the flywheel diode D3. Accordingly, the current IL1 keeps equal to the current ID3 from time t4 till time t0 at which the switching element Q1 is turned on again, and the electromagnetic energy stored up in the choke coil L1 is discharged to the output side during the period. A voltage induced in the secondary winding T2B of the auxiliary transformer T2 by interrupting the current ID3 has a forward direction with respect to the diode D2, so the current ID2 is caused to flow in the second series circuit composed of the secondary winding T2B and the diode D2, whereby the electromagnetic energy stored up in the auxiliary transformer T2 is caused to return to the DC power source Vi. The current ID2 may be caused to flow at most during period t3-t6 at which the switching element Q1 stays turned off. Also, during the period at which the current ID2 flows, a voltage composed such that a flyback voltage of the auxiliary transformer 2 is superposed on the input DC voltage Vi is applied as the drain-to-source voltage Vds of the switching element Q1.

Then, when the switching element Q1 is turned on at time t0 thereby allowing electrical conduction between the drain and the source thereof, the drain-to-source voltage Vds drops to zero, and the drain current Id starts to flow. Here, since the first series circuit is composed of the switching element Q1 and the primary winding T2A of the auxiliary transformer T2, an inclination is given to the drain current Id rising from 0 A by the inductance of the primary winding T2A (period t0-t1). Also, since the current ID3, the drain current Id, and the current IL1 satisfy the relation of "IL1=ID3+Id" during the rising period (t0-t1), the current ID3 is caused to decrease, and the voltage VD3 across the both terminals of the flywheel diode D3 starts to increase (period t1-t2) when the current ID3 comes down to zero at time t1 where the current IL1 becomes equal to the drain current Id again.

Thus, the drain current Id of the switching element Q1 increases with the inclination given by the inductance of the primary winding T2A of the auxiliary transformer T2, and therefore is almost at zero at the moment the switching element Q1 is turned on (at time t0), thus a zero voltage switching is realized thereby reducing switching loss. And, the current ID3 of the flywheel diode D3 decreases at period t0-t1 with an inclination inverse to that of the drain current Id, and since the voltage VD3 is applied across the both terminals of the flywheel diode D3 after the current ID3 comes down to zero, loss due to the recovery current of the flywheel diode D3 can be reduced. Since the inductance to give the inclination to the rise of the current Id is constituted by the auxiliary transformer T2, the electromagnetic energy stored up in the auxiliary transformer T2 can be returned to the DC power source Vi when the switching element Q1 is turned off, whereby it is prevented from happening that a high voltage is generated at the turn-off of the switching element Q1 causing the destruction of the switching element Q1, and at the same time the efficiency of the DC-DC converter can be improved.

Since, as described above, a voltage composed such that a flyback voltage of the auxiliary transformer 2 is superposed on the input DC voltage V1 is applied as the drain-to-source voltage Vds of the switching element Q1 during the period at which the current ID2 flows in the diode D2, the winding ratio NAB of the auxiliary transformer T2 has to be appropriately determined with the withstand voltage across the drain and source of the switching element Q1 taken into consideration.

In the DC-DC converter 10 of FIG. 1, the first series circuit, which is composed of the primary winding T2A of the auxiliary transformer T2 and the switching element Q1, is disposed such that the primary winding T2A is connected to the DC power source Vi and the switching element Q1 is connected to the choke coil L1, and the second series circuit, which is composed of the secondary winding T2B of the auxiliary transformer T2B and the diode D2, is connected in parallel to the DC power source Vi, but the present invention is not limited to such an arrangement. For example, as shown in a DC-DC converter 20 of FIG. 4, a first series circuit composed of a primary winding T2A of an auxiliary transformer T2 and a switching element Q1 may alternatively be arranged such that one terminal of the primary winding T2A is connected to the source terminal of the switching element Q1, the drain terminal of the switching element Q1 is connected to the positive terminal of a DC power source Vi, and that the other terminal of the primary winding T2A is connected to the junction of a choke coil L1 and the cathode terminal of a flywheel diode D3. Also, a second series circuit composed of a secondary winding T2B of the auxiliary transformer T2 and a diode D2 may have its one terminal connected to one terminal (output terminal) of an output capacitor C5, instead of the positive terminal of the DC power source Vi, whereby the electromagnetic energy stored up in the auxiliary transformer T2 is discharged to the output side thereby reducing unavailable energy, thus energy efficiency can be improved.

Figure 4:
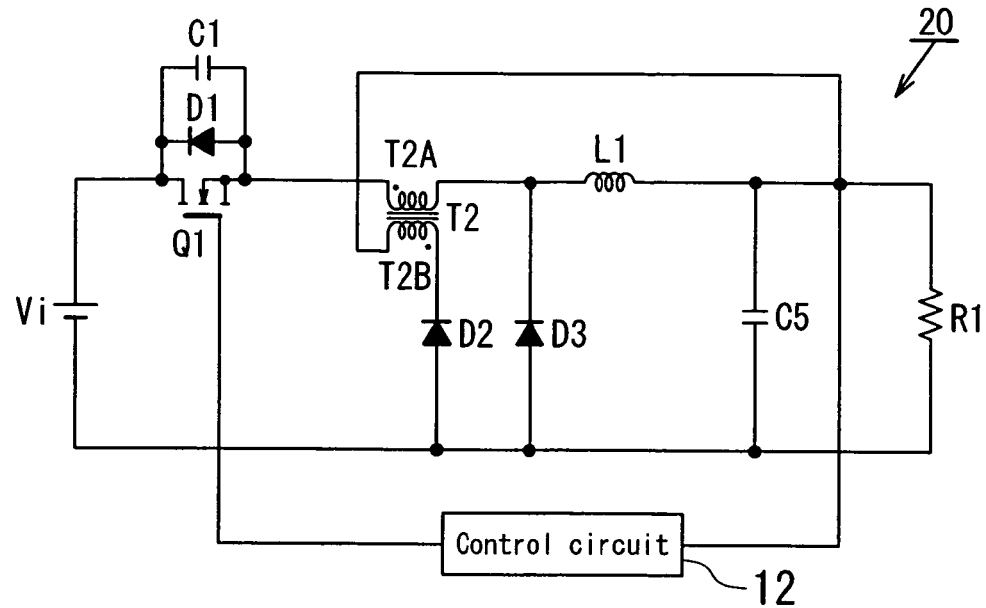
FIG. 4 is a circuit diagram of another exemplar of the DC-DC according to the first embodiment of the present invention.

The DC-DC converter 10 of FIG. 1 includes a circuitry in which the electromagnetic energy stored up in the auxiliary transformer T2 is returned to the DC power source Vi, and the DC-DC converter 20 of the FIG. 4 includes a circuitry in which the electromagnetic energy stored up in the auxiliary transformer T2 is discharged to the output side, but in the present invention, an optimal circuitry may be appropriately selected depending on the output specification of a DC-DC converter.

DC-DC converters according to exemplary embodiments other than the first embodiment described above will hereinafter be described, wherein their fundamental operations are similar to that of the first embodiment explained with reference to FIGS. 2A, 2B and 3 and therefore will be described only briefly, and focus will be put on structures peculiar to respective embodiments.

Figure 5:
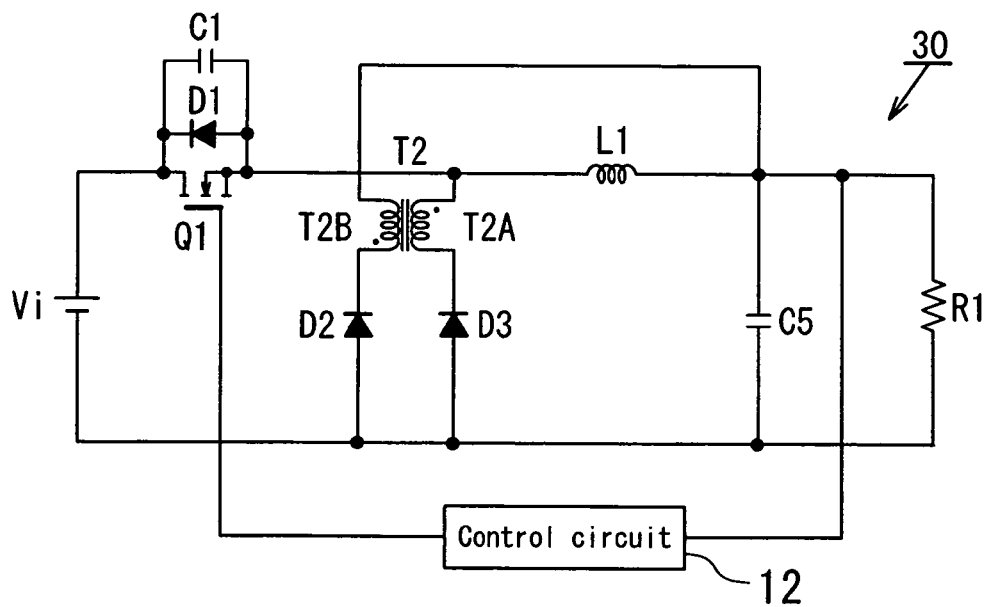
FIG. 5 is a circuit diagram of a DC-DC converter according to a second embodiment of the present invention.

Referring to FIG. 5, a DC-DC converter 30 according to a second embodiment of the present invention is a stepdown DC-DC converter having a structure similar to those of the DC-DC converter 10 and 20 shown in FIG. 1 and FIG. 4, respectively, but differs from them in that a first series circuit is composed of a primary winding T2A of an auxiliary transformer T2 and a flywheel diode D3 such that one terminal of the primary winding T2A is connected to the cathode terminal of the flywheel diode D3.

In the DC-DC converter 30, a second series circuit is composed of a secondary winding T2B of the auxiliary transformer T2 and a diode D2 such that one terminal of the secondary winding T2B is connected to the cathode terminal of the diode D2, wherein the other terminal of the secondary winding T2B is connected to one terminal (output terminal) of an output capacitor C5, and the anode terminal of a diode D2 is connected to the negative terminal of a DC power source Vi. A rectifying smoothing circuit is composed of the aforementioned first series circuit which has its one terminal (toward the primary winding T2A) connected to one terminal of a choke coil L1, and the output capacitor C5 which has its one terminal (output terminal) connected to the other terminal of the choke coil L1, and the other terminal (toward the anode of the flywheel diode D3) of the first series circuit, together with the other terminal of the output capacitor C5, is connected to the negative terminal of the DC power source Vi. And, a switching element Q1 is connected via its one terminal (drain) to the positive terminal of the DC power source Vi and via its other terminal (source) to the junction of the choke coil L1 and the first series circuit.

In the DC-DC converter 30, the inductance of the primary winding T2A connected in series to the flywheel diode D3 gives a negative inclination to a current ID3 flowing in the flywheel diode D3, and a voltage VD3 across the both terminals of the flywheel diode D3 is caused to increase after the current ID3 arrives at zero in the same way as in the case of the DC-DC converter 10. And, since the relation of "IL1=ID3+Id" is seen at period t0-t1 also in the second embodiment, the drain current Id flowing in the switching element Q1 is caused to rise from 0 A with an inclination. Thus, the DC-DC converter 30 achieves the same operation and advantage as the DC-DC converter according to the first embodiment described above.

Figure 6:
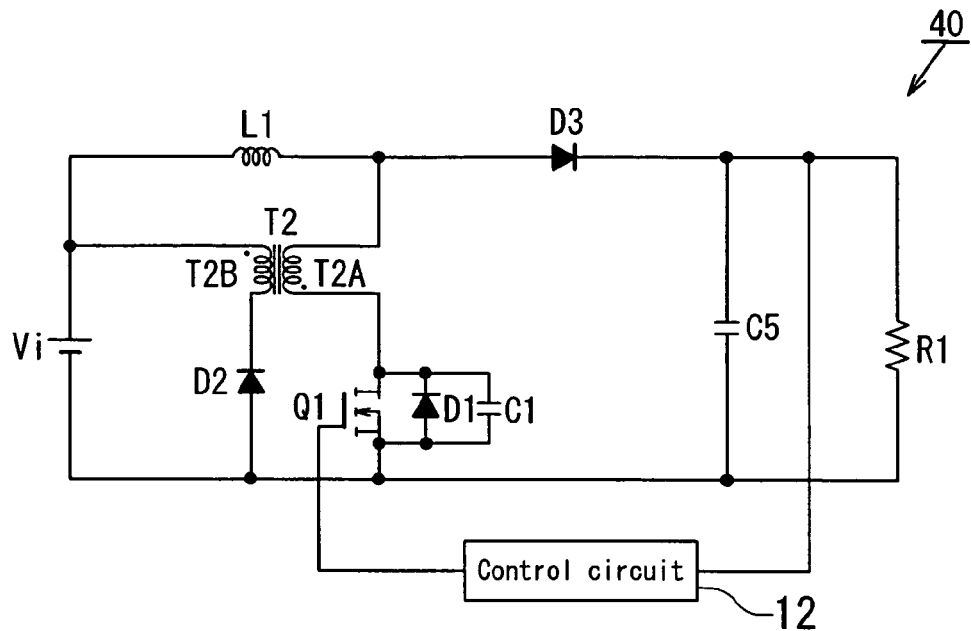
FIG. 6 is a circuit diagram of a DC-DC converter according to a third embodiment of the present invention.

Referring to FIG. 6, a DC-DC converter 40 according to a third embodiment of the present invention, unlike the DC-DC converters 10, 20 and 30 according to the first and second embodiments described so far, is a step-up DC-DC converter. In the DC-DC converter 40, a primary winding T2A of an auxiliary transformer T2 and a switching element Q1 constitute a first series circuit such that the primary winding T2A has its one terminal connected to the drain terminal of the switching element Q1, and a secondary winding T2B of the auxiliary transformer T2 and a diode D2 constitute a second series circuit such that one terminal of the secondary winding T2B is connected to the cathode terminal of the diode D2, wherein the other terminal of the secondary winding T2B is connected to the positive terminal of a DC power source Vi, and the anode terminal of the diode D2 is connected to the negative terminal of the DC power source Vi.

In the DC-DC converter 40, a rectifying smoothing circuit is composed of a flywheel diode D3 having its anode terminal connected to one terminal of a choke coil L1, and an output capacitor C5 having its one terminal (output terminal) connected to the cathode terminal of the flywheel diode D3. The other terminal of the choke coil L1 is connected to the positive terminal of the DC power source Vi, one terminal (toward the primary winding T2A) of the first series circuit is connected to the junction of the choke coil L1 and the flywheel diode D3, and the other terminal (toward the source of the switching element Q1) of the first series circuit, together with the other terminal of the output capacitor C5, is connected to the negative terminal of the DC power source Vi. The DC-DC converter 40 thus structured achieves the same operation and advantage as the DC-DC converters according to the first and second embodiments described above.

Figure 7:
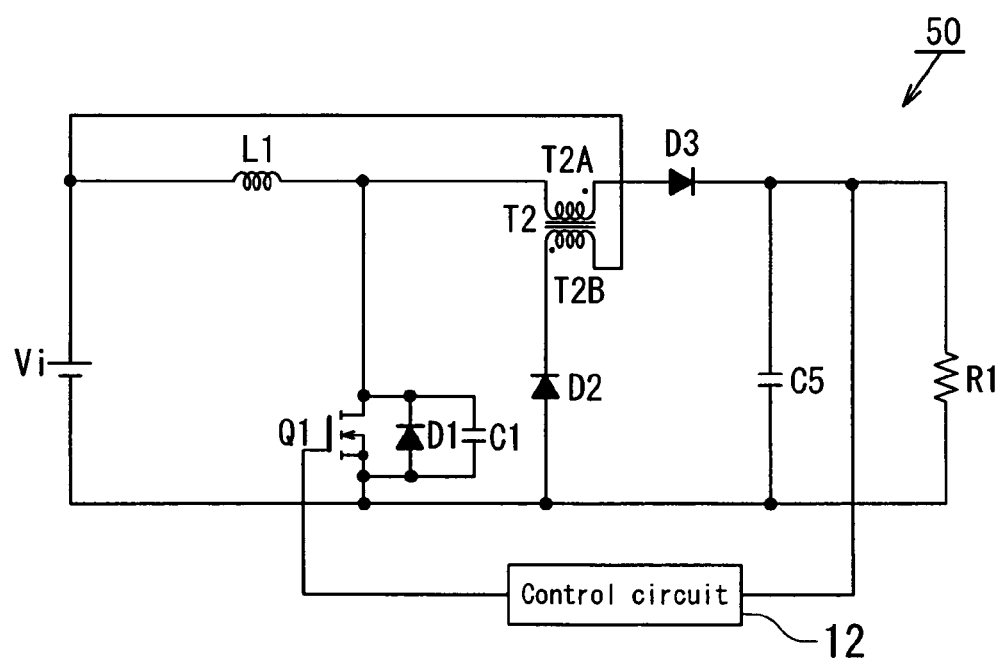
FIG. 7 is a circuit diagram of a DC-DC converter according to a fourth embodiment of the present invention.

Referring to FIG. 7, a DC-DC converter 50 according to a fourth embodiment of the present invention is a step-up DC-DC converter having a structure which is basically same as that of the DC-DC converter 40 of FIG. 6 but differs in that a first series circuit is constituted by a primary winding T2A of an auxiliary transformer T2 and a flywheel diode D3 such that one terminal of the primary winding T2A is connected to the anode terminal of the flywheel diode D3, while a second series circuit is constituted identically to that of the DC-DC converter 40, specifically is composed of a secondary winding T2B and a diode D2 such that one terminal of the secondary winding T2B is connected to the cathode terminal of the diode D2, wherein the other terminal of the secondary winding T2B is connected to the positive terminal of a DC power source Vi, and the anode terminal of the diode D2 is connected to the negative terminal of the DC power source Vi.

In the DC-DC converter 50, a rectifying smoothing circuit is composed of the first series circuit which has its one terminal (toward the primary winding T2A) connected to one terminal of a choke coil L1, and an output capacitor C5 which has its one terminal (output terminal) connected to the other terminal (toward the cathode of the flywheel diode D3) of the first series circuit. The other terminal of the choke coil L1 is connected to the positive terminal of the DC power source Vi, one terminal (drain terminal) of a switching element Q1 is connected to the junction of the choke coil L1 and the first series circuit, and the other terminal (source terminal) of the switching element Q1, together with the other terminal of the output capacitor C5, is connected to the negative terminal of the DC power source Vi. The DC-DC converter 50 thus structured achieves the same operation and advantage as the DC-DC converters according to the first to third embodiments described above.

Figure 8:
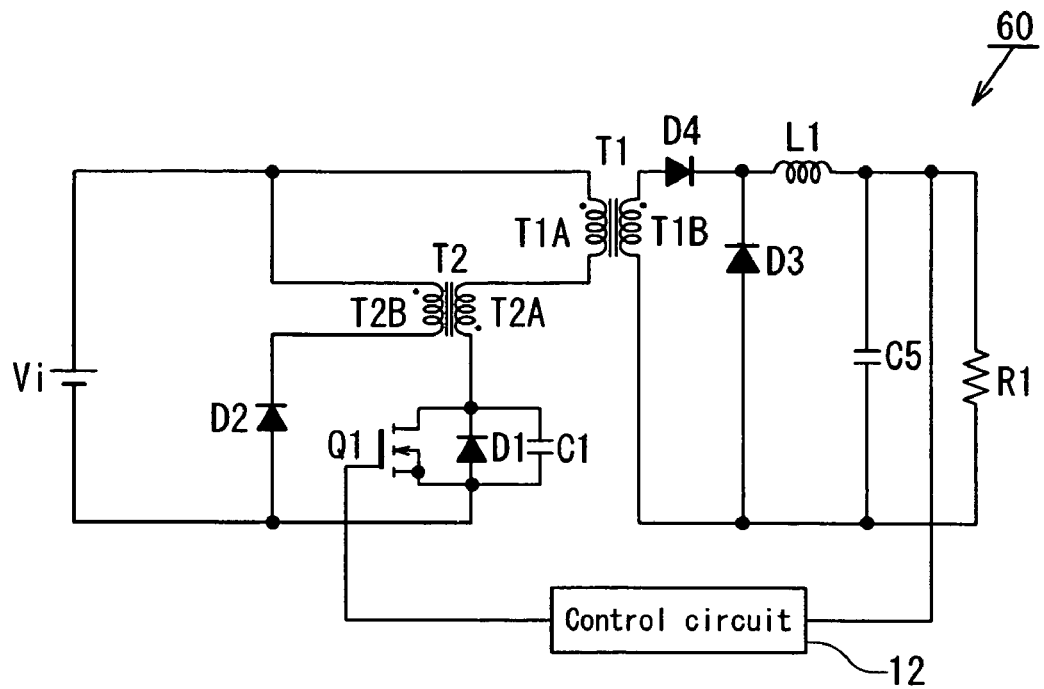
FIG. 8 is a circuit diagram of a DC-DC converter according to a fifth embodiment of the present invention.

Referring to FIG. 8, a DC-DC converter 60 according to a fifth embodiment of the present invention is an insulating forward DC-DC converter. The DC-DC converter 60, compared with the DC-DC converter 10 of FIG. 1, differs in that a main transformer T1 is further provided so as to insulate between the input side and the output side, and also an output rectifying diode D4 as a rectifying smoothing circuit diode according to the present invention is further provided at the secondary side of the main transformer T1.

In the DC-DC converter 60, a first series circuit is composed of a primary winding T2A of an auxiliary transformer T2, and a switching element Q1 such that one terminal of the primary winding T2A is connected to the drain terminal of the switching element Q1, and a second series circuit is composed of a secondary winding T2B of the auxiliary transformer T2 and a diode D2 such that one terminal of the secondary winding T2B is connected to the cathode terminal of the diode D2, wherein the other terminal of the secondary winding T2B is connected to the positive terminal of a DC power source Vi, and the anode terminal of the diode D2 is connected to the negative terminal of the DC power source Vi.

Also, a rectifying smoothing circuit is formed at the secondary side of the main transformer T1 and is composed of the aforementioned output rectifying diode D4 which has its anode terminal connected to one terminal of a secondary winding T1B of the main transformer T1 and has its cathode terminal connected to one terminal of a choke coil L1, an output capacitor C5 which has its one terminal (output terminal) connected to the other terminal of the choke coil L1, and a flywheel diode D3 which has its one terminal (cathode terminal) connected to the junction of the choke coil L1 and the output rectifying diode D4 and has its other terminal, together with the other terminal of the output capacitor C5, connected to the other terminal of the secondary winding T1B of the main transformer T1. One terminal of the primary winding T1A of the main transformer T1 is connected to the positive terminal of the DC power source Vi, one terminal (toward the primary winding T2A of the auxiliary transformer T2) of the first series circuit is connected to the other terminal of the primary winding T1A of the main transformer T1, and the other terminal (toward the source of the switching element Q1) of the first series circuit is connected to the negative terminal of the DC power source Vi. The insulating forward DC-DC converter 60 thus structured achieves the same operation and advantage as the DC-DC converters according to the first to fourth embodiments described above.

Figure 9:
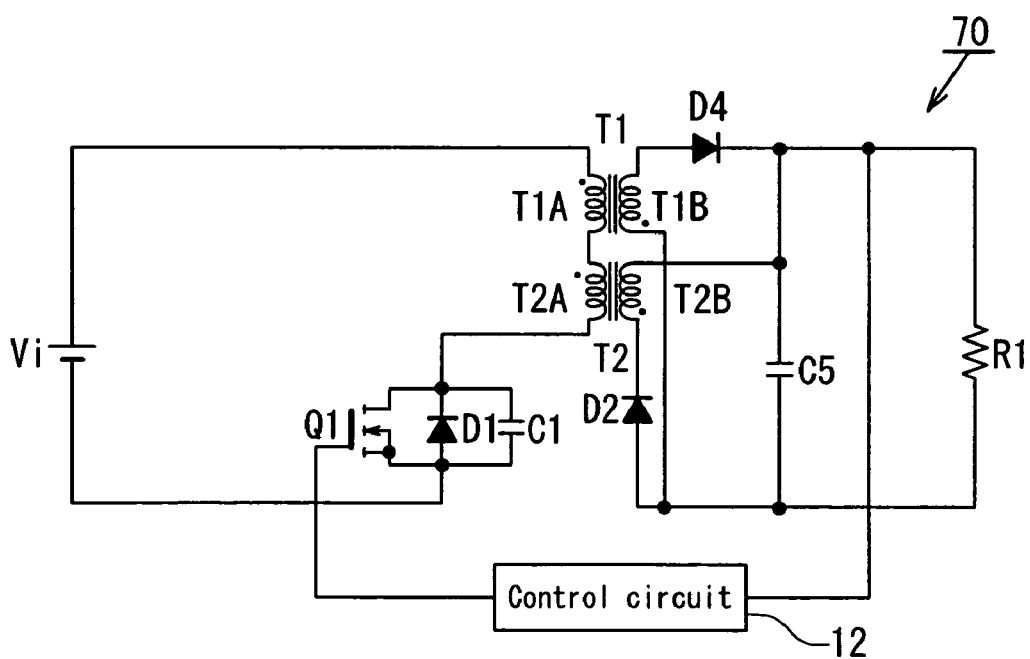
FIG. 9 is a circuit diagram of a DC-DC converter according to a sixth embodiment of the present invention.

Referring to FIG. 9, a DC-DC converter 70 according to a sixth embodiment of the present invention is an insulating flyback DC-DC converter. The DC-DC converter 70, compared with the DC-DC converter 40 of FIG. 6, differs in that a main transformer T1 is provided in place of the choke coil L1 so as to insulate between the input side and the output side.

In the DC-DC converter 70, a first series circuit is composed of a primary winding T2A of an auxiliary transformer T2 and a switching element Q1 such that one terminal of the primary winding T2A is connected to the drain terminal of the switching element Q1, and a second series circuit is composed of a secondary winding T2B of the auxiliary transformer T2 and a diode D2 such that one terminal of the secondary winding T2B is connected to the cathode terminal of the diode D2, wherein the other terminal of the secondary winding T2B is connected to one terminal (output terminal) of an output capacitor C5, and the anode terminal of the diode D2 is connected to the other terminal of the output capacitor C5.

A rectifying smoothing circuit is formed at the secondary side of the main transformer T1 and is composed of an output rectifying diode D4 which has its anode terminal connected to one terminal of a secondary winding T1B of the main transformer T1, and the aforementioned output capacitor C5 which has its one terminal (output terminal) connected to the cathode terminal of the output rectifying diode D4, wherein the other terminal of the output capacitor C5, together with the anode terminal of the diode D2, is connected to the other terminal of the secondary winding T1B of the main transformer T1. One terminal of a primary winding T1A of the main transformer T1 is connected to the positive terminal of a DC power source Vi, one terminal (toward the primary winding T2A of the auxiliary transformer T2) of the first series circuit is connected to the other terminal of the primary winding T1A of the main transformer T1, and the other terminal (toward the source of the switching element Q1) is connected to the negative terminal of the DC power source Vi.

The DC-DC converters 60 and 70 according respectively to the fifth and sixth embodiments of the present invention are DC-DC converters provided with a typical insulation circuit, in which the auxiliary transformer T2 as a principal constituent element of the present invention is applied, and are adapted to achieve the same operation and advantage as the DC-DC converters according to the first to fourth embodiments described above.

In the forward DC-DC converter 60, the main transformer T1 functions as a power transferring means for an insulated area between the input output sides, and an inductance element is constituted by the choke coil L1 connected at the secondary side of the main transformer T1, on the other hand in the flyback DC-DC converter 70, the main transformer T1 functions not only as a power transferring means for an insulated area between the input and output sides but also as an inductance element according to the present invention. Also, in both the DC-DC converters 60 and 70, the first series circuit may alternatively be constituted such that the primary winding T2A of the auxiliary transformer T2 is connected in series to either the output rectifying diode D4 or the flywheel diode D3, which are rectifying smoothing circuit diodes. Further, it can be appropriately determined depending on the specification of a DC-DC converter if the electromagnetic energy stored up in the auxiliary transformer T2 is to be returned to the DC power source Vi or discharged to the output side.

Figure 10C:
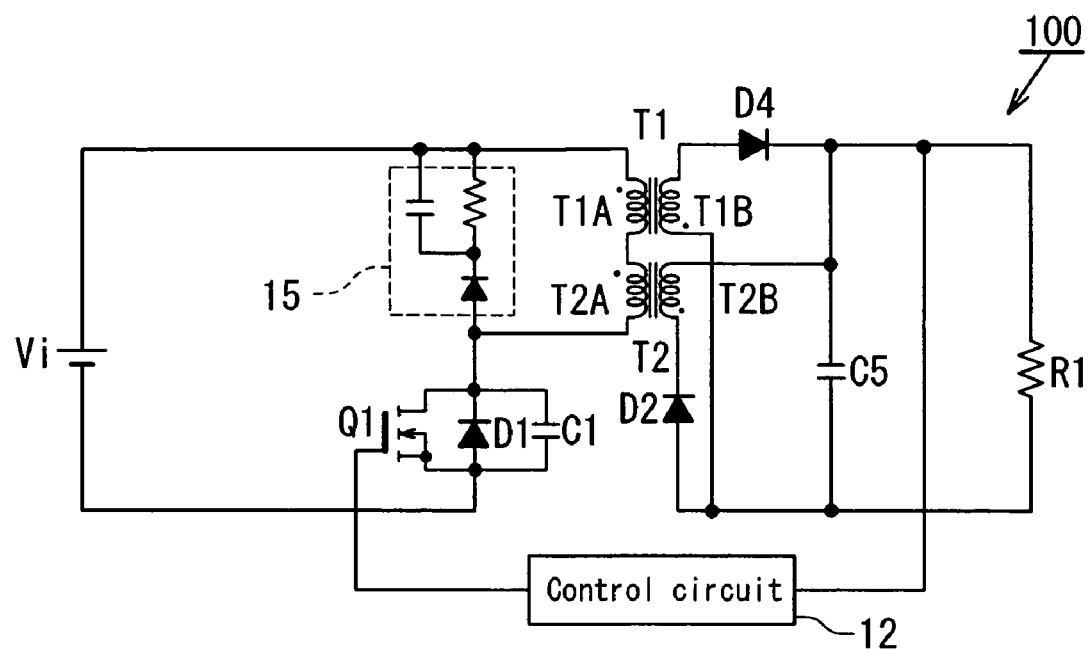

Referring to FIGS. 10A, 10B and 10C, DC-DC converters 80, 90, 100 according to respective variations of a seventh embodiment of the present invention each include a basic circuit structured according to the present invention and provided with a typically known snubber circuit. The DC-DC converter 80 of FIG. 10A includes the above-described DC-DC converter 10 provided with a snubber circuit 13, the DC-DC converter 90 of FIG. 10B includes the above-described DC-DC converter 60 provided with another snubber circuit 14, and the DC-DC converter 100 includes the above-described DC-DC converter 70 provided with still another snubber circuit 15.

Provision of a snubber circuit is effective when the switching element Q1 cannot tolerate a surge voltage generated at turn-off of the switching element due to the influence of the leakage inductance of the auxiliary transformer T2. That is to say, the surge voltage generated at turn-off of the switching element is duly restricted by the snubber circuit and thereby prevented from influencing the switching element Q1. In this connection, a snubber circuit employed here is not limited to the exemplar circuits 13, 14 and 15 but various circuitries may be appropriately applied.

The present invention is not limited to the exemplar embodiments described above. For example, the diode D2 is connected in series to the secondary winding T2B of the auxiliary transformer T2 in the embodiments described above but may be connected in a different way insofar as the diode D2 and the secondary winding T2B constitute a series circuit in which a current follows in an appropriate direction. Also, a resistor, a current transformer, and the like for current detection may be provided in series to the switching element Q1 or to a line carrying an input or output current.

What is claimed is:

1. A DC-DC converter comprising:
a switching element to perform a switching operation thereby converting a DC electric power supplied from a DC power source into an AC electric power;
an inductance element to store up and discharge the AC electric power;
a rectifying smoothing circuit to rectify and smooth the AC electric power discharged and reconvert the AC electric power back into a DC electric power, the rectifying smoothing circuit comprising a rectifying smoothing circuit diode and an output capacitor;
a diode; and
an auxiliary transformer having a primary winding and a secondary winding, wherein: the primary winding and one member of the switching element and the rectifying smoothing circuit diode constitute a first series circuit such that the primary winding is connected in series to the one member; the secondary winding and the diode constitute a second series circuit such that the secondary winding is connected in series to the diode, where one terminal of the second series circuit is connected to one terminal of one of the DC power source and the output capacitor, and the other terminal of the second series circuit, together with the other terminal of the output capacitor, is connected to the other terminal of the DC power source; and an electromagnetic energy stored up in the auxiliary transformer is either returned to the DC power source via the second series circuit or discharged to an output side when the switching element turns on and off.

2. A DC-DC converter according to claim 1, wherein: the first series circuit comprises the switching element; the rectifying smoothing circuit comprises the rectifying smoothing circuit diode which has one terminal thereof connected to one terminal of the inductance element, and the output capacitor which has one terminal thereof connected to the other terminal of the inductance element; one terminal of the first series circuit is connected to the one terminal of the DC power source, and the other terminal of the first series circuit is connected to a junction of the inductance element and the rectifying smoothing circuit diode; and the other terminal of the rectifying smoothing circuit diode, together with the other terminal of the output capacitor, is connected to the other terminal of the DC power source.

3. A DC-DC converter according to claim 1, wherein: the first series circuit comprises the rectifying smoothing circuit diode; the rectifying smoothing circuit comprises the first series circuit which has one terminal thereof connected to one terminal of the inductance element, and the output capacitor which has one terminal thereof connected to the other terminal of the inductance element; one terminal of the switching element is connected to the one terminal of the DC power source, and the other terminal of the switching element is connected to a junction of the inductance element and the first series circuit; and the other terminal of the first series circuit, together with the other terminal of the output capacitor, is connected to the other terminal of the DC power source.

4. A DC-DC converter according to claim 1, wherein: the first series circuit comprises the switching element; the rectifying smoothing circuit comprises the rectifying smoothing circuit diode which has one terminal thereof connected to one terminal of the inductance element, and the output capacitor which has one terminal thereof connected to the other terminal of the rectifying smoothing circuit diode; the other terminal of the inductance element is connected to the one terminal of the DC power source; and one terminal of the first series circuit is connected to a junction of the inductance element and the rectifying smoothing circuit diode, and the other terminal of the first series circuit, together with the other terminal of the output capacitor, is connected to the other terminal of the DC power source.

5. A DC-DC converter according to claim 1, wherein: the first series circuit comprises the rectifying smoothing circuit diode; the rectifying smoothing circuit comprises the first series circuit which has one terminal thereof connected to one terminal of the inductance element, and the output capacitor which has one terminal thereof connected to the other terminal of the first series circuit; the other terminal of the inductance element is connected to the one terminal of the DC power source; and one terminal of the switching element is connected to a junction of the inductance element and the first series circuit, and the other terminal of the switching element, together with the other terminal of the output capacitor, is connected to the other terminal of the DC power source.

6. A DC-DC converter according to claim 1, further comprising a main transformer to insulate between an input side and an output side.

7. A DC-DC converter according to claim 6, wherein the DC-DC converter is a forward converter.

8. A DC-DC converter according to claim 6, wherein the DC-DC converter is a flyback converter.

9. A DC-DC converter according to claim 1, further comprising a snubber circuit.

* * * * *